US012571826B2

(12) United States Patent
Huber et al.

(10) Patent No.: US 12,571,826 B2
(45) Date of Patent: Mar. 10, 2026

(54) MEASUREMENT DEVICE AND METHOD FOR ANALYZING A DEVICE-UNDER-TEST

(71) Applicant: Rohde & Schwarz GmbH & Co. KG, Munich (DE)

(72) Inventors: Florian Huber, Munich (DE); Florian Galler, Mering (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 142 days.

(21) Appl. No.: 18/409,434

(22) Filed: Jan. 10, 2024

(65) Prior Publication Data

US 2024/0319246 A1     Sep. 26, 2024

(30) Foreign Application Priority Data

Mar. 20, 2023     (EP) ..................................... 23162773

(51) Int. Cl.
G01R 29/08 (2006.01)

(52) U.S. Cl.
CPC .................................. G01R 29/0878 (2013.01)

(58) Field of Classification Search
CPC .... G01R 29/0878; G01R 27/32; G01R 27/28; G01R 31/00
See application file for complete search history.

(56) References Cited

U.S. PATENT DOCUMENTS

| | | | |
|---|---|---|---|
| 7,019,510 B1 | 3/2006 | Bradley | |
| 7,521,939 B2 | 4/2009 | Bradley | |
| 8,278,944 B1 * | 10/2012 | Noujeim | G01R 27/04 |
| | | | 324/637 |
| 8,417,189 B2 | 4/2013 | Noujeim et al. | |
| 9,116,187 B1 | 8/2015 | Owen et al. | |
| 9,239,371 B1 * | 1/2016 | Bradley | H03G 11/02 |
| 9,991,933 B2 * | 6/2018 | Schmid | H04B 3/466 |
| 10,003,416 B1 * | 6/2018 | Lloyd | H03F 1/3241 |
| 11,506,694 B1 | 11/2022 | Fastner et al. | |
| 2015/0309101 A1 | 10/2015 | Ballo et al. | |
| 2023/0019522 A1 | 1/2023 | Magers et al. | |
| 2023/0092327 A1 * | 3/2023 | Bonaguide | G01R 29/0814 |
| | | | 324/95 |

OTHER PUBLICATIONS

Office Action for related European Patent Application No. 23162773. 8-1001, dated Oct. 13, 2023.

* cited by examiner

*Primary Examiner* — Alvaro E Fortich
(74) *Attorney, Agent, or Firm* — DITTHAVONG, STEINER & MLOTKOWSKI

(57) ABSTRACT

A measurement device, e.g., a vector network analyzer, for analyzing a device-under-test, DUT is provided. The measurement device comprises a signal generator to generate a test signal; test ports, connected to the DUT, which forward the test signal to the DUT, and/or receive a response signal from the DUT; and signal paths electrically connected the signal generator by one of the test ports. At least one of the signal paths comprises: a measurement unit to measure RF signals; a reference coupler to forward a decoupled portion of the test signal; a first measurement coupler to forward a first decoupled portion of the response signal; and a second measurement coupler to forward a second decoupled portion of the response signal. The second measurement coupler adapts a characteristic of the second decoupled portion of the response signal to differ from the first decoupled portion of the response signal.

17 Claims, 6 Drawing Sheets

MEASUREMENT DEVICE AND METHOD FOR ANALYZING A DEVICE-UNDER-TEST

RELATED APPLICATION

This application claims priority to European Patent Application No. 23 162 773.8, entitled "Measurement Device and Method for Analyzing a Device-Under-Test," filed Mar. 20, 2023, which is incorporated herein by reference in its entirety.

TECHNICAL FIELD OF THE INVENTION

The invention relates to a measurement device, in particular a vector network analyzer, for analyzing a device-under-test (DUT). The invention further relates to a related method of analyzing a DUT.

BACKGROUND OF THE INVENTION

Vector network analysis is a key technique in radio frequency (RF)/microwave measurements. In general, a vector network analyzer (VNA) generates calibrated RF stimulus signals which are input to a device-under-test (DUT) and analyzes the response of the DUT to this stimulation. For instance, the VNA can measure an amplitude or a phase response of the DUT to the stimulus signals.

Typically, a user wants to measure the DUT in the shortest time possible with a certain accuracy. Based on the VNA-performance, in particular its dynamic range and trace noise performance, the measurement speed is adapted to reach the accuracy limit.

The level of a signal received from the DUT at the VNA can span several orders of magnitude, e.g., if the DUT is a filter with high isolation in the stopband and low loss in the passband. Therefore, it is known to adapt a signal gain of the VNA according to the output level of the DUT. In this way, the sensitivity level (characterized by a noise figure) and a linearity of the VNA (characterized by an input compression point) are shifted to an improved operation point.

Some VNAs can operate in two modes, a low noise (LN) mode and a low distortion (LD) mode. In the LN mode, the VNA is optimized for a lowest possible VNA noise figure and a lower compression point is accepted. In the LD mode, the VNA can be optimized for a sufficiently high compression point by adding attenuation. However, this also increases the noise figure in the LD mode and, thus, the trace noise also increases. The DUT is often measured with both of these two modes to determine the best mode for certain frequency ranges.

However, the switching from one mode to the other can be visible in the form of small "steps" in the measurement. In order to mask these steps the input level threshold, which determines the switch from a high gain to a low gain setting, is often set very low (e.g., −40 dBm) so that the "step" is masked in the trace noise. Therefore, for medium input levels (e.g., −40 to 0 dBm) where a high gain setting would normally be favorable, it is often not used.

In summary, measuring with different gain settings in a VNA may cause additional switching and settling times, leading to prolonged measurement times. Furthermore, the switching can generate visible switching artifacts.

Thus, it is an objective to provide an improved measurement device and an improved method of analyzing a DUT, which avoid the above mentioned disadvantages.

SUMMARY OF THE INVENTION

The object of the present invention is achieved by the solution provided in the enclosed independent claims.

Advantageous implementations of the present invention are further defined in the dependent claims.

According to a first aspect, the invention relates to a measurement device for analyzing a device-under-test (DUT). The measurement device comprises: a signal generator configured to generate a test signal; two or more test ports, wherein each of the two or more test ports is adapted to be connected to the DUT, wherein each of the two or more test ports is further adapted to forward the test signal to the DUT and/or to receive a response signal from the DUT. The measurement device further comprises two or more signal paths, wherein each of the two or more signal paths is arranged to electrically connect the signal generator to one of the test ports. Thereby, at least one of the two or more signal paths comprises: a measurement unit configured to measure RF signals; a reference coupler configured to forward a decoupled portion of the test signal to the measurement unit; a first measurement coupler configured to forward a first decoupled portion of the response signal to the measurement unit; and a second measurement coupler configured to forward a second decoupled portion of the response signal to the measurement unit; wherein the second measurement coupler is configured to adapt a characteristic of the second decoupled portion of the response signal such that the second decoupled portion differs from the first decoupled portion of the response signal.

This achieves the advantage that the DUT can be analyzed quickly and with high accuracy. By simultaneously measuring decoupled portions of the response signal with different characteristics, in particular with different gain/attenuation, it is not necessary to repeat a measurement with different modes (e.g., different gain control modes) or to switch between different modes when analyzing a DUT. In this way, a dynamic of the measurement device, e.g. a VNA, can be enhanced. Further, switching artifacts (from switching from one mode to another during a measurement) can be avoided.

Preferably, the measurement device is a vector network analyzer (VNA).

The measurement device can comprises 3, 4, 8, 16, 32 or 64 test ports. The measurement device can further comprise a dedicated signal path for each test port. Each signal path can be designed essentially identical, i.e., can comprise the same components and features.

For example, two, more or all of the signal paths of the measurement device may comprise: a respective measurement unit configured to measure RF signals, a respective reference coupler configured to forward at least a decoupled portion of the test signal to the measurement unit; a respective first measurement coupler configured to forward a first decoupled portion of the response signal to the measurement unit; and a respective second measurement coupler configured to forward a second decoupled portion of the response signal to the measurement unit; wherein the second measurement coupler is configured to adapt a characteristic of the second decoupled portion of the response signal such that the first decoupled portion differs of the response signal from the second decoupled portion of the response signal.

The test signal and the response signal can be RF signals, for instance, in a frequency range between 9 kHz and 300 GHz.

The test signal can be an "excitation signal", i.e., a signal used to excite the DUT. The response signal can be the signal with which the DUT "responds" to the test signal. For example, the response signal is an attenuated version of the test signal which is reflected or transmitted by the DUT. The response signal can be an output signal of the DUT. The test signal and the response signal can have the same frequency.

Each signal path can be configured to forward the test signal to the DUT, via the connected test port, and receive a first response signal (e.g., a reflected signal) traveling from the DUT via the same connected test port. At the same time, each signal path can be configured to receive, via the connected test port, a second response signal (e.g., a transmitted signal) which was forwarded to the DUT via a different of the signal paths (and test ports).

The DUT can be an RF device, such as a filter, an amplifier, a coupler or an antenna. In particular, the level of the response signal of the DUT can thereby vary strongly, e.g. over several orders of magnitude, depending on the frequency of the test signal.

The signal generator can be configured to perform a frequency sweep. In other words, the signal generator can gradually or stepwise increase or decrease the frequency of the test signal.

Measuring an RF signal with the measurement unit may refer to measuring a signal level and/or a phase value of the RF signal in (at a given frequency of the RF signal).

The decoupled portion of the test signal as well as the first and the second decoupled portion of the response signal can be generated by decoupling (e.g., magnetically) or redirecting (e.g., via a switch) at least a part of the test signal respectively the response signal.

For example, the decoupled portions of the test and/or response signals can differ only in signal strength (or signal level) from the "original" test and/or response signals. In some cases, the decoupled portion of a test and/or a response signals can even be identical to the test respectively the response signal (e.g., if a switch is used to redirect the signal and no signal characteristic is changed.).

The two or more test ports of the measurement device can be adapted to be connected to respective ports of the DUT.

A coupler can be any passive structure that is able to couple (or decouple) a portion of a signal to a third port. For example, the reference coupler, the first measurement coupler and/or the second measurement coupler can comprise or form such a coupler.

In an embodiment, the second measurement coupler is configured to increase and/or decrease a signal level of the second decoupled portion of the response signal.

In particular, the measurement coupler can be configured to adapt the signal level or magnitude of the second decoupled portion of the response signal, such that the second decoupled portion of the response signal has a different signal level or signal strength than the first decoupled portion of the response signal.

Measuring two decoupled portions of the response signal with different attenuations/amplifications achieves the advantage that the measurement time can be reduced, because a measurement does not have to be repeated with different gain mode settings if a recorded signal level was too high or low.

Furthermore, the first measurement coupler and the second measurement coupler can have different sensitivity levels. For instance, the first measurement coupler has a sensitivity level of −150 dBm/Hz, while the second measurement coupler has a sensitivity level of −160 dBm/Hz.

In an embodiment, the second measurement coupler comprises at least one amplifier to increase the signal level of the second decoupled portion of the response signal and/or at least one attenuator to decrease a signal level of the second decoupled portion of the response signal.

4

The attenuators and/or amplifiers can be arranged prior to a mixer of the second measurement coupler. Thus, an RF signal (and not an IF signal) is attenuated respectively amplified.

For instance, the amplifiers allow weaker signals to be measured (sensitivity is shifted to weaker signals), and the attenuators allows stronger signals to be measured (sensitivity is shifted to stronger signals). The amplifiers and/or attenuators can be adjustable with regards to an amplification factor and/or an attenuation factor.

In an embodiment, the second measurement coupler comprises a switching unit; wherein, in a first switching state, the switching unit is configured to switch the at least one amplifier in front of the measurement unit; and, in a second switching state, the switching unit is configured to switch the at least one attenuator in front of the measurement unit. This achieves the advantage that a signal level of a response signal can be both increased or decreased.

Here, the switching unit switching the at least one amplifier or the at least one attenuator 'in front of' the measurement unit may refer to the switching unit electrically connecting a signaling line of the at least one signal path with the measurement unit through the at least one amplifier or the at least one attenuator.

In particular, the amplifiers and/or attenuators and the switching unit are arranged between a coupling port of the second measurement coupler and the measurement unit.

In an embodiment, the measurement device further comprises a processing unit which is configured to receive the measurements of the decoupled portion of the test signal, the first decoupled portion of the response signal and/or the second decoupled portion of the response signal from the measurement unit, in particular in digital form; wherein the processing unit is configured to calculate at least one DUT specific property based on said measurements.

For example, the processing unit is configured to calculate S-parameters of the DUT based on said measurements.

Alternatively or additionally, the processing unit can be configured to calculate a compression point of the DUT based on said measurements.

In an embodiment, the reference coupler, the first measurement coupler, and/or the second measurement coupler each comprise at least one of: a directional coupler, a directional bridge, a resistive tap, a switch, a balun, or a diplexer.

For example, each signal paths comprises an electrical line connecting the signal generator with a test port of the measurement device. The respective directional coupler, directional bridge, resistive tap, switch, balun, or diplexer can be configured to tap a signal on said electrical line.

In an embodiment, the measurement unit comprises a respective dedicated measurement receiver for each of: the reference coupler, the first measurement coupler and the second measurement coupler.

Each dedicated measurement receiver can be configured to receive the signal forwarded by the reference coupler, the first measurement coupler or the second measurement coupler, respectively.

The measurement receivers connected of the first measurement coupler, and the second measurement coupler can be level shifted receivers. For example, a sensitivity level of the measurement receiver connected to the first measurement coupler (first receiver) is −150 dBm/Hz and a sensitivity level of the measurement receiver connected to the second measurement coupler (second receiver) is −160 dBm/Hz.

In an embodiment, the measurement unit comprises a common receiver which is configured to receive a signal forwarded from at least two of: the reference coupler, the first measurement coupler and the second measurement coupler.

For example, the common receiver only receives one signal at a time. This achieves the advantage that the complexity and cost of the measurement device can be reduced.

For example, each of the measurement receivers and/or the common receiver may each comprise an analog-to-digital converter (ADC) which is configured to digitalize the signal received at the respective receiver.

The measurement receivers that are connected to the first and second measurement coupler can be configured to measure and sample the received decoupled portions of the response signal from the DUT simultaneously.

In an embodiment, the common receiver is arranged to receive the decoupled portion of the test signal from the reference coupler and the second decoupled portion of the response signal from the second measurement coupler.

In an embodiment, the at least one of the signal paths further comprises a first switch configured to selectively connect the second measurement coupler or the reference coupler to the common receiver.

In an embodiment, the at least one of the signal paths further comprises a second switch configured to selectively connect the signal generator or the second measurement coupler to the test port that is connected to the signal path.

For example, the second switch is configured to selectively connect the signal generator or the measurement coupler to the signal path and therefore in turn to the test port.

In an embodiment, the signal generator comprises a single signal source or a plurality of signal sources, for example one signal source for each signal path.

For example, the signal generator is configured to only output the test signal to one signal path.

In an embodiment, a first signal path of the two or more signal paths is configured to forward, via its connected test port, the test signal from the signal generator to the DUT and to receive a first response signal from the DUT; and a second signal path of the two or more signal paths is configured to receive, via its connected test port, a second response signal from the DUT; wherein the measurement unit of the first signal path is configured to measure the decoupled portion of the test signal as well as a first and/or a second decoupled portion of the first response signal; and wherein the measurement unit of the second signal path is configured to only measure a first and a second decoupled portion of the second response signal.

For example, the first response signal is a reflected signal from the DUT and the second response signal is a signal that is transmitted by the DUT. Bot the first and the second signal path can be configured according to the at least one signal path according to the first aspect of the invention, i.e., they can comprise a respective measurement unit, reference coupler, as well as first and second measurement couplers.

According to a second aspect, the invention relates to a method of analyzing a DUT, wherein the method comprises the steps of:

a) connecting the DUT to a first test port and to a second test port of a measurement device;

b) generating a test signal with the measurement device;

c) forwarding the test signal to the DUT via the first test port;

d) receiving a first response signal from the DUT to test signal at the first test port and receiving a second response signal from the DUT to the test signal at the second test port;

e) measuring a decoupled portion of the test signal and a decoupled portion of the first response signal; and f) simultaneously measuring a first decoupled portion and a second decoupled portion of the second response signal and processing the first decoupled portion and the second decoupled portion in the digital domain; wherein, prior to the measurement of the second decoupled portion, a characteristic, in particular a signal level, of the second decoupled portion of the second response signal is adapted such that the second decoupled portion differs from the first decoupled portion of the second response signal.

In an embodiment, the method further comprises the steps of:

g) generating a further test signal with the measurement device;

h) forwarding the further test signal to the DUT via the second test port, i) receiving a first response signal from the DUT to the further test signal at the second test port and receiving a second response signal from the DUT to the further test signal at the first test port;

j) repeating the steps e)-f) for the further test signal and the first and the second response signal to the further test signal.

The method may comprise the further the step of:

k) calculating s-parameters and/or a compression point of the DUT based on the measurements of the decoupled portions of the test signal and the further test signal as well as the decoupled portions of the first and the second response signals.

The method can be carried out with a measurement device, for example a VNA, according to the first aspect of the invention. As such, the method can be a method for operating such a measurement device.

In particular, the above description with regard to the measurement device according to the first aspect of the invention is correspondingly valid for the method according to the second aspect of the invention.

BRIEF DESCRIPTION OF THE DRAWINGS

The invention will be explained in the following together with the figures.

DETAILED DESCRIPTION OF THE PREFERRED EMBODIMENTS

Figure 1:
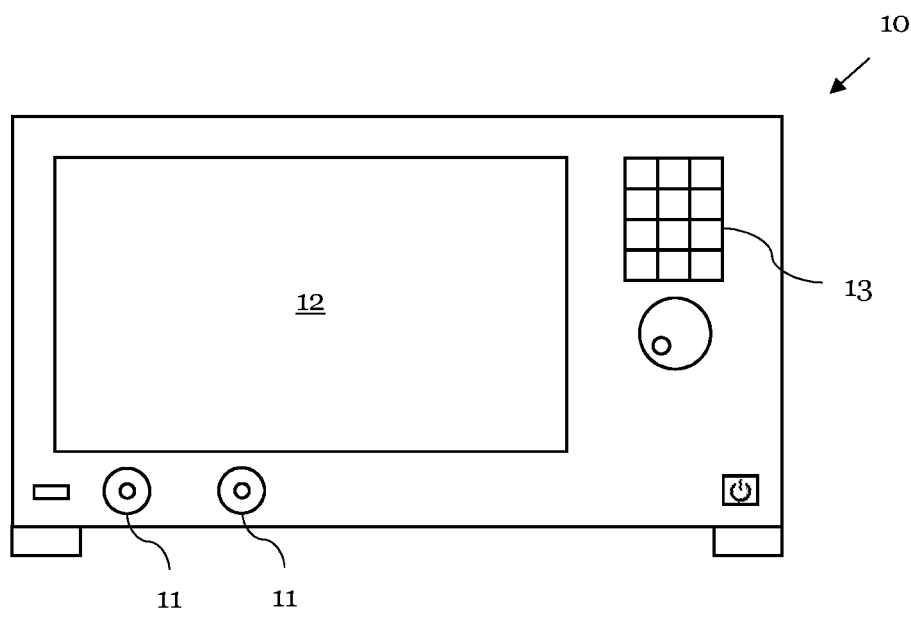
FIG. 1 shows a schematic of an exterior of a measurement device according to an embodiment.

FIG. 1 shows a schematic of an exterior of a measurement device 10 according to an embodiment. The measurement device 10 is, for example, a vector network analyzer (VNA).

The measurement device 10 shown in FIG. 1 comprises two test ports 11. Each of these test ports 11 can be adapted to be connected to a device-under-test (DUT) for forwarding test signals to the DUT and/or for receiving response signals from the DUT. For instance, the test ports 11 are RF ports, e.g., coaxial ports for connecting coaxial cables.

While FIG. 1 only shows two test ports 11, the measurement device 10 could also comprise a larger number of test ports, e.g., 3, 4, 8, 16 or 32 test ports.

For example, as shown in FIG. 1, the measurement device 10 may further comprise a display 12 configured to display measured signals and an interface 13 for receiving control commands from a user.

In the following FIGS. 2-7, possible schematics of a measurement device 10 for analyzing a DUT, such as the device shown in FIG. 1, are depicted.

Figure 2:
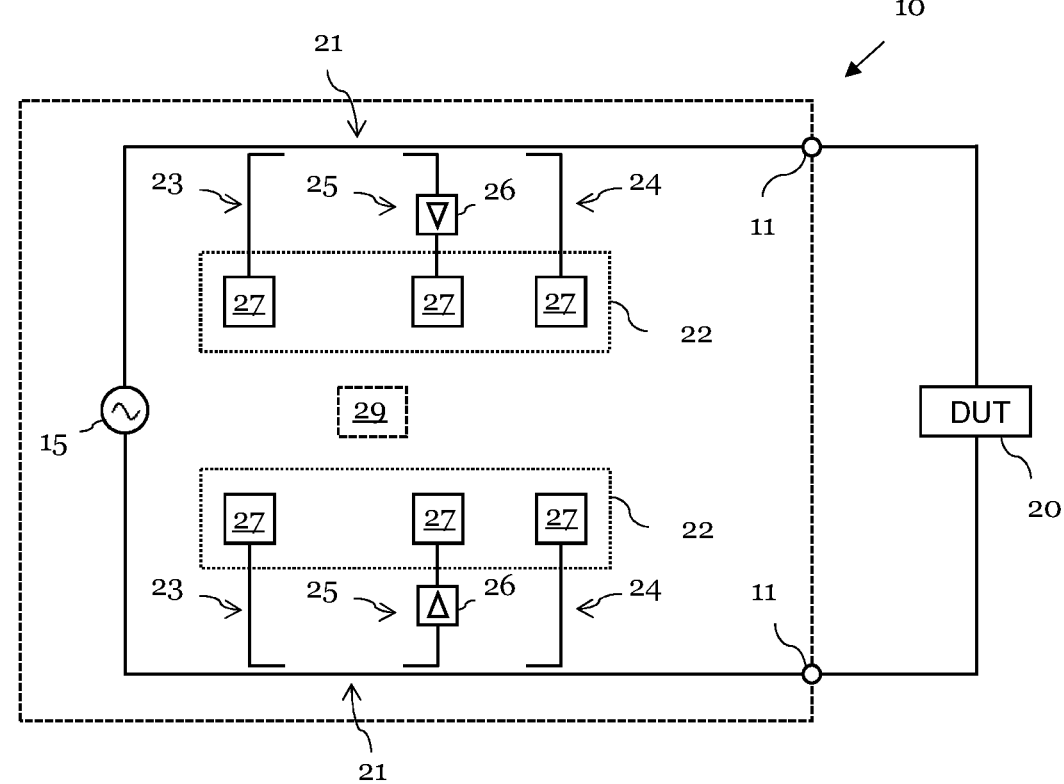
FIG. 2 shows a schematic diagram of a measurement device according to an embodiment.

Thereby, FIG. 2 shows a schematic diagram of the measurement device 10 according to an embodiment.

The measurement device 10 comprises a signal generator 15 configured to generate a test signal; two or more test ports 11, wherein each of the two or more test ports 11 is adapted to be connected to the DUT 20, and to forward the test signal to the DUT 20 and/or to receive a response signal from the DUT 20; and two or more signal paths 21, wherein each of the two or more signal paths 21 is arranged to electrically connect the signal generator to one of the test ports 20. At least one of the signal paths 21 thereby comprises: a measurement unit 22 configured to measure RF signals; a reference coupler 23 configured to forward a decoupled portion of the test signal to the measurement unit 22; a first measurement coupler 24 configured to forward a first decoupled portion of the response signal to the measurement unit 22; and a second measurement coupler 25 configured to forward a second decoupled portion of the response signal to the measurement unit. The second measurement coupler 25 is configured to adapt a characteristic of the second decoupled portion of the response signal such that the second decoupled portion differs from the first decoupled portion of the response signal.

The measurement device 10 can be a vector network analyzer (VNA).

The DUT 20 can be an RF device, such as a filter, an amplifier, a coupler or an antenna. In particular, the level of the response signal of the DUT 20 can vary strongly, e.g. over several orders of magnitude depending on the frequency of the test signal.

In the examples shown in FIG. 2 and the subsequent FIGS. 3-7, the measurement device 10 comprises two test ports 11 and two signal paths 21, wherein the DUT 20 is connected to both test ports 11. Both signal paths 21 can thereby be essentially identical and can comprise the same features and components. In particular, each signal path 21 comprises a respective measurement unit 22, a respective reference coupler 23, and respective first and second measurement couplers 24, 25.

In particular, both the first and the second measurement coupler 24, 25 can receive and forward a portion of the DUT response signal "traveling" from the test port 11 in the direction of the signal generator 15. This response signal can be a reflected or a transmitted signal (i.e., reflected or transmitted by the DUT 20). The reference coupler 23 can be configured to receive and forward a portion of the test signal that is traveling from the signal generator 15 towards the port 11.

The adapted signal characteristic can be a signal level or signal strength. In particular, the second measurement coupler 25 can be configured to increase or decrease a signal level of the second decoupled portion of the response signal.

For instance, the second measurement coupler 25 comprises additional means for attenuating or amplifying the forwarded portion of the response signal.

In the example shown in FIG. 2, the second measurement coupler 25 comprises an amplifier 26. The amplifier can be a low noise amplifier (LNA). In this way, the receipt of weak RF signals via the additional second measurement coupler 25 can be improved. This allows, for example, to analyze a DUT 20 which outputs very weak response signals at certain frequencies, e.g., a filter.

Figure 5:
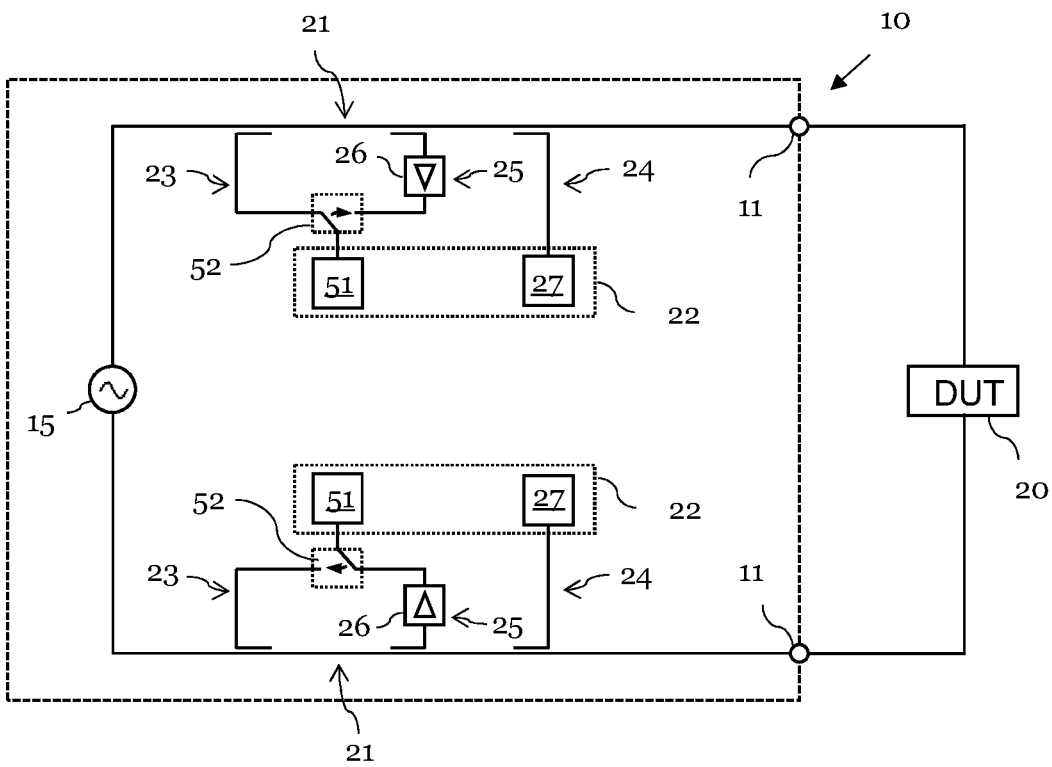
FIG. 5 shows a schematic diagram of a measurement device according to an embodiment.
Figure 7:
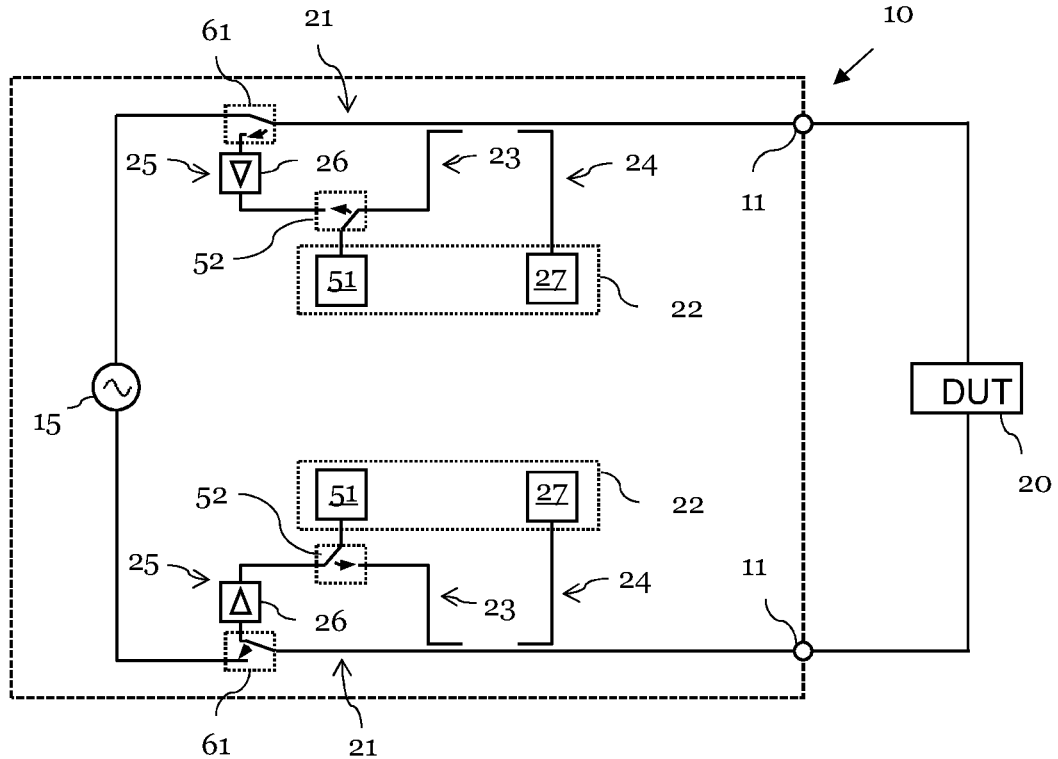
FIG. 7 shows a schematic diagram of a measurement device according to an embodiment.

The measurement units 22 can comprises a respective dedicated measurement receiver 27 for each of the reference coupler 23, the first measurement coupler 24 and the second measurement coupler 25. Alternatively, at least two of the couplers 23, 24, 25 can share a receiver 51 as shown in FIGS. 5 and 7.

Each receiver 27, 51 can comprise an analog-to-digital converter (ADC). Alternatively, respective ADCs can be arranged as separate components which receive the signals from the measurement receivers 27, 51. Two or more receivers 27, 51 could also share an ADC.

The ADCs can be configured to digitalize the decoupled test signal, the first decoupled response signal and/or the second decoupled response signal.

In addition, each signal path 21 can comprise at least one mixer, to down-convert a high frequency signal (e.g., to an intermediate frequency, IF, signal). For instance, a respective mixer can be arranged before each receiver 27.

The measurement device can comprise a processing unit 29 which is configured to receive the measurements of the decoupled test signal, the first decoupled response signal and/or the second decoupled response signal from the measurement unit 22, in particular in digital form.

The processing unit 29 can be a microprocessor or an ASIC.

For example, for further processing and/or visualization, the processing unit 29 can be configured to use the digitalized portion of the response signals from the receiver connected to the first measurement coupler 24 or from the receiver connected to the second measurement coupler 25, depending on which of these signals is more suitable (e.g., due to its S/N ratio). The other signal can be discarded.

For example, by offsetting the receiver 27 connected to the second measurement coupler 25 to a higher gain, the measurement range of the then so-called low noise receiver (LN receiver) may extend the measurement range to a lower power level compared to a measurement range of the receiver 27 connected to the first measurement coupler (MEAS receiver). Accordingly, by offsetting the LN receiver to a lower gain, the LN receiver can function as a low distortion (LD) receiver, extending the measurement range to higher power levels.

The measurement results of both receivers are simultaneously available in the digital domain and are processed according to a signal input power. For instance, a level range can be defined in which a weighted sum of both results can be formed. In this way, any measurement "steps" normally present in hard-switched AGC (automatic gain control) architectures can be smeared out. The dynamic ranges of both receivers 27 connected to the measurement couplers 24, 25 (LN and MEAS receiver) can be digitally merged to form a dynamic range exceeding the ones of a single receiver.

For example, during such a measurement there is no additional switching or settling time to be accounted for, since the signal portions received at the receivers 27 of the first measurement coupler 24 (also referred to as MEAS receiver) and the second measurement coupler 25 (also referred to as LN receiver) can be evaluated in parallel by the measurement device 10.

In particular, there is no hard-switching between the evaluated results of the LN receiver and the MEAS necessary. Both measurement results can be available in the digital domain and can be weighted to form the sum of the results. In this way, switching artifacts can be smeared over the range where both measurement receiver deliver a meaningful result. As a consequence, a switching "point" (or range) can be set to fully utilize a linearity range of the second measurement coupler 25 respectively LN receiver (e.g. 0 dBm). For instance, for medium input levels the VNA architecture can be optimally used which can results in reduced measurement times.

For example, a measurement with the measurement device 10 can be carried out as follows: The upper (first) signal path 21 of the device 10 in FIG. 2 outputs the test signal via the connected (upper) test port 11, and receives a first response signal from the DUT 20 via said upper test port 11. This first response signal, which travels from the port 11 in the direction of the signal generator 15, can be a signal that was reflected by the DUT 20. The measurement unit 22 of the first (upper) signal path 21 can be configured to measure: (i) a portion of the test signal forwarded by the reference coupler 23 from the signal generator 15, and (ii) a first and/or a second portion of the first reference signal forwarded by the first and/or second the measurement coupler 24, 25 respectively. The lower (second) signal path 21 of the device 10 in FIG. 2 can be configured to receive a second response signal via the connected test port 11. This second response signal can be a signal that was transmitted by the DUT. The first and the second measurement couplers 24, 25 of the second signal path 21 can be configured to forward a first and a second portion of this second response signal to the measurement unit 22 of the second signal path 21.

Subsequently, the measurement can be repeated with reversed signal paths, i.e., the second (lower) signal path 21 outputs a test signal via the second test port 21, whereas test signal and the first (reflected) response signal are measured in the second (lower) signal path 21 and the second (transmitted) response signal is measured in the first (upper) signal path 21 in the same way as before. Typically, the portion of the reference signal is thereby only measured in the signal path 21 which is used for forwarding the test signal to the DUT and receiving the first (reflected) response signal, and not in the other signal path 21 which is used for receiving the second (transmitted) response signal.

The processing unit 29 can be configured to calculate at least one DUT 20 specific property based on the measurements of the decoupled test signal, the first decoupled response signal and/or the second decoupled response signal. For examples, the processing unit 29 can be configured to calculate S-parameters and/or a compression point of the DUT 20 based on the said measurements.

In particular, a measurement of both receiving path (via first and second measurement coupler 24, 25) can be done in parallel. Depending on the signal level, the measured signal from a respective path can be used immediately and no extra measurement needs to be started for each path. For example, the processing unit can immediately use the measurement value of the other coupler if the signal level reaches a certain threshold.

The measurement device 10 can comprise additional test ports 11 and/or signal paths 21. For instance, the measurement device 10 can comprise 3, 4, 8, 16, 32 or 64 test ports 11, with a dedicated signal path 21 for each test port.

The reference couplers 23, the first measurement couplers 24, and/or the second measurement couplers 25 can each comprise at least one of: a directional coupler, a directional bridge, a resistive tap, a switch, a balun, or a diplexer.

For example, each signal paths 21 comprises an electrical line connecting the signal generator 15 with a respective test port 11. The respective directional coupler, directional bridge, resistive tap, switch, balun, or diplexer can be configured to tap a signal on said electrical line.

The signal generator 15 may comprise one signal source which can be selectively connected to the signal paths 21, e.g. via a switching unit. Alternatively, the signal generator 15 might comprise a plurality of signal sources. For example, the signal generator 15 comprises a respective signal source for each test port 11 and/or for each signal path 21 of the measurement device 10.

For example, the signal generator 15 can comprise one or more oscillators and one or more mixers, e.g., to up-convert a generated test signal.

The signal generator 15 can be configured to perform a frequency sweep. In other words, the signal generator can gradually or stepwise increase or decrease the frequency of the test signal.

During such a frequency sweep, the test signal can be forwarded to the DUT via one of test ports 11 (e.g., the first test port). Subsequently, the frequency sweep can be repeated while forwarding the test signal 21 to the DUT 20 via the other (second) test port 11.

Figure 3:
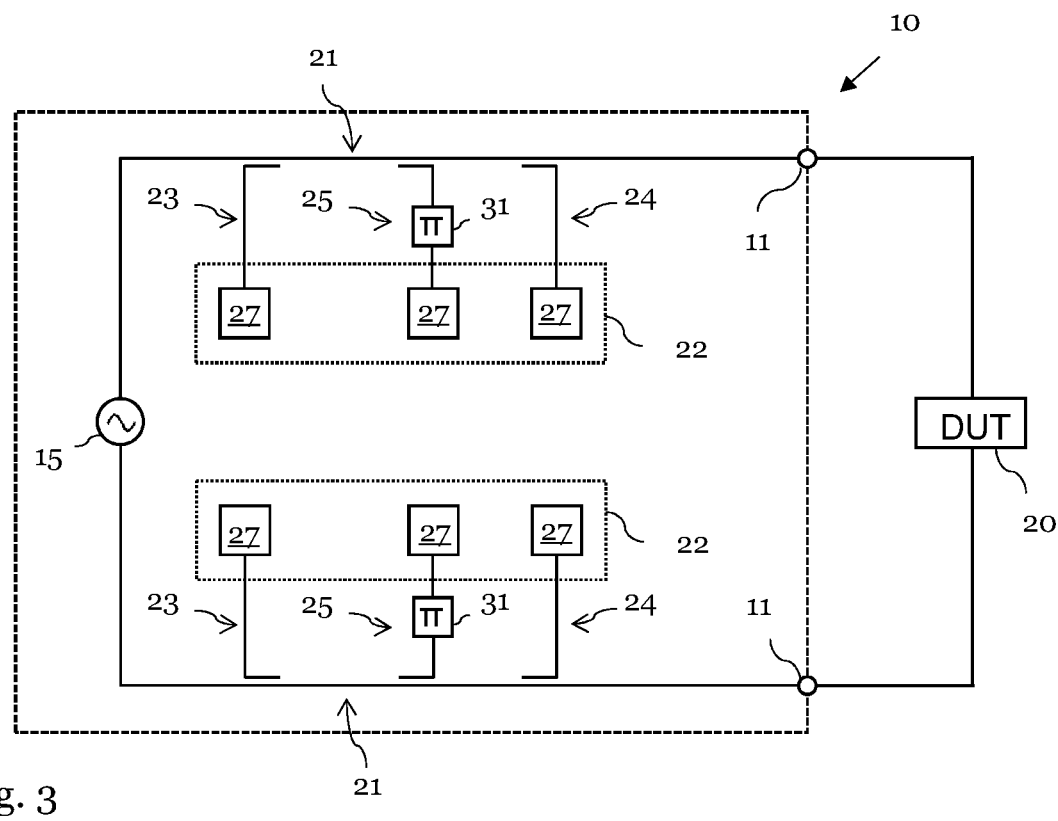
FIG. 3 shows a schematic diagram of a measurement device according to an embodiment.

FIG. 3 shows a schematic diagram of the measurement device 10 according to an embodiment.

In the device 10 shown in FIG. 3, the second measurement coupler 25 of each signal path 21 comprises an attenuator 31 instead of an amplifier 26. This allows to measure response signals with a high signal level. For example, an analysis of a DUT 20 that outputs very strong response signals at certain frequencies, e.g. an amplifier, can be facilitated by the attenuation in the second measurement coupler 25.

Due to the attenuation, the receiver 27 connected to the second measurement coupler 25 can form an LD receiver.

In general, the difference in conversion gain between the first and second measurement couplers 24, 25 can be achieved by using one or a combination of attenuators, e.g. LNAs, step attenuators, fixed attenuators or couplers with different coupling losses.

Figure 4:
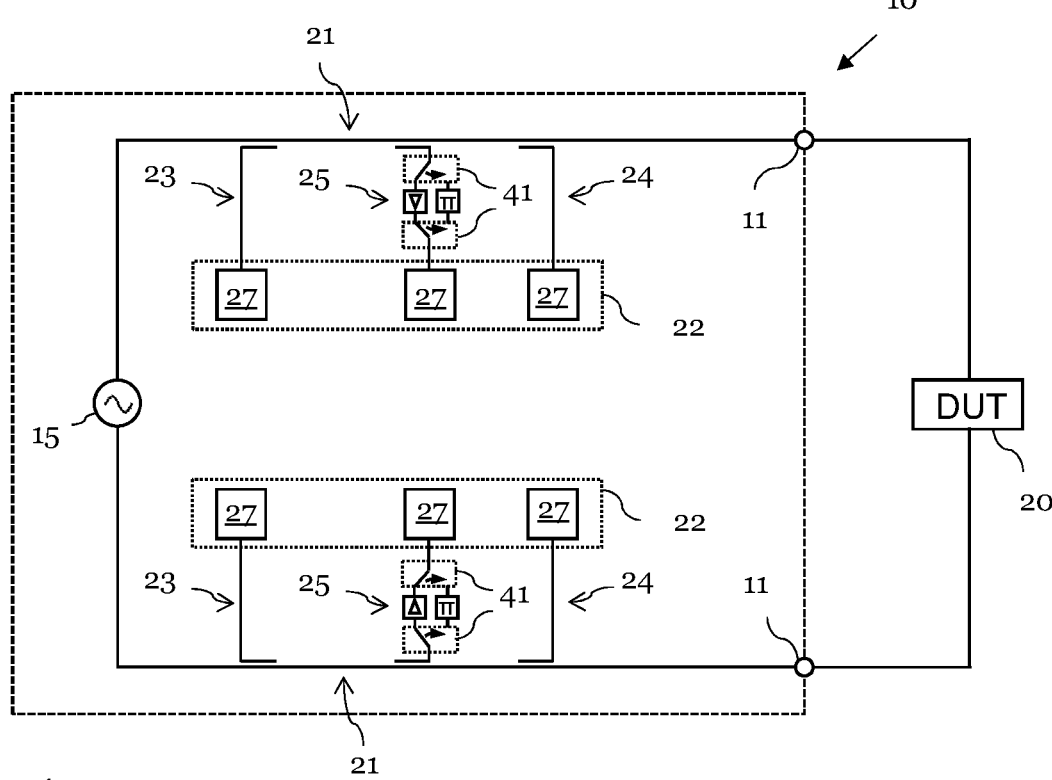
FIG. 4 shows a schematic diagram of a measurement device according to an embodiment.

FIG. 4 shows a schematic diagram of the measurement device 10 according to an embodiment.

In the device 10 shown in FIG. 4, the second measurement coupler 25 of each signal path 21 comprise both the amplifier 26 and the attenuator 31. The amplifier 26 and the attenuator 31 can each comprise a plurality of amplification respectively attenuation stages.

The measurement device 10 in FIG. 4 further comprises a switching unit 41 in each signal path 21.

For instance, in a first switching state, the switching unit 41 is configured to switch the amplifier 26 before the receiver 27 of the second measurement coupler, and, in a second switching state, the switching unit 41 is configured to switch the attenuator 31 before the receiver 27 of the second measurement coupler.

The switching unit 41 can comprise two switches which are arranged before and after the amplifier 26 and attenuator 31.

For example, the amplifier or the attenuator are used based on the signal strength of the decoupled signal portion (s). For instance, the signal strength can be determined based on the decoupled signal portion received via the first measurement coupler 24. Is the signal received via the first measurement coupler 24 very weak, then the amplifier can be switched in front of the receiver 27. Is the signal received by the first measurement coupler very strong (e.g., of the first measurement coupler 24 ADC is almost maxed out), then the attenuator can be switched in front of the receiver 27.

FIG. 5 shows a schematic diagram of the measurement device 10 according to an embodiment.

In the device 10 shown in FIG. 5, the measurement unit 22 of each signal path 21 comprises a common receiver 51 which is alternately connectable to the reference coupler 23 and the second measurement coupler 25. In this way, the complexity of the device 10 can be reduced.

The common receiver 51 can be configured to receive the portion of the test signal wave, which travels from the signal generator 15 towards the port 21, and/or the second portion of the response signal wave, which travels in opposite direction, i.e., from the port 21 towards the signal generator 15. The response signal can be a reflected or transmitted signal.

In each signal path 21, a switch 52 can be configured to connect the respective coupler 23, 25 with the common receiver 51.

In the example shown in FIG. 5, the switches 52 in the first (upper) signal path 21 and second (lower) signal path 21 have a different switching position. With the depicted switching positions, the test signal wave is measured by the common receiver 51 of the first signal path 21, and in the second signal path 21 the transmitted response signal is measured via the first and the second measurement couplers 24, 25, wherein the second measurement coupler 24 forwards the decoupled signal via the additional amplifier 26 to the common receiver 51. For example, a measurement with this calibration is feasibly since the reference signal of the respective receiving port 21 (in FIG. 6 the lower port) is not required to calculate s-parameters. For instance, a calibration can be carried out based on a 10-term model.

Figure 6:
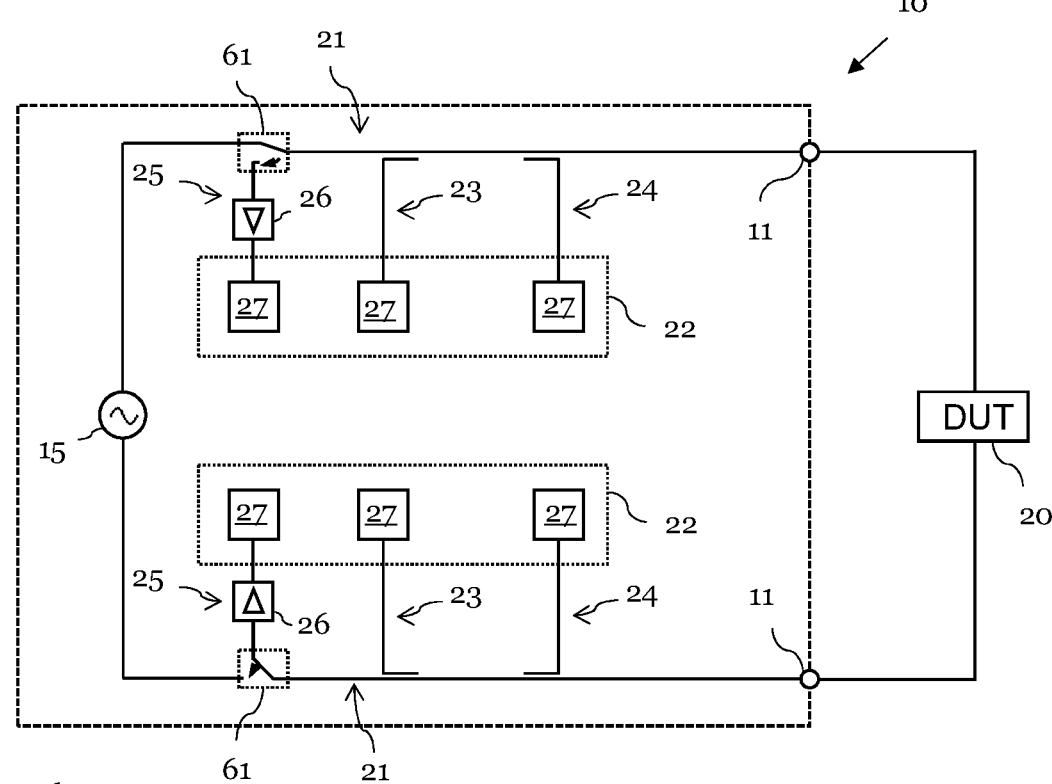
FIG. 6 shows a schematic diagram of a measurement device according to an embodiment.

FIG. 6 shows a schematic diagram of the measurement device 10 according to an embodiment.

In the device 10 shown in FIG. 6, the second measurement couplers 25 of each signal path 21 comprise a further switch 61. In particular, the second measurement couplers 25 can be coupled to the electrical line of the respective signal path 21 via the further switch 61. In this way, the coupling of the second measurement couplers 25 can become a galvanic coupling.

In the first (upper) signal path 21, the switch 61 is arranged in a first switching position in which it connects the signal generator 15 to the test port 21. In this switching position, the receiver 27 of the second measurement coupler 25 is disconnected from an electrical line of the signal path 21 and does not receive any signals.

In the second (lower) signal path 21, the switch 61 is arranged in a second switching position in which it connects the port 21 with the receiver 27 of the second measurement coupler 25 such that the measurement unit 22 of the second signal path 21 can receives both decoupled portions of the response signal. In this switching position, the reference coupler (which is, e.g., not needed in the second signal path) is disconnected.

For example, the second measurement coupler 25 can be arranged to be closer to the signal generator 15 than the first measurement coupler 24 and the reference coupler 23.

FIG. 7 shows a schematic diagram of the measurement device 10 according to an embodiment. In particular, FIG. 7 shows a measurement device which comprises both switches 52, 61 from FIGS. 5 and 6.

The measurement device 10 in FIG. 7 comprises an additional receiver 51 in each signal path 21, which is connected to the reference coupler 23 and the second measurement coupler 25. At the same time, the further switches 61 can disconnect the first or second signal path 21 from the signal generator 15.

For example, using the switches 61 may further extend the minimum achievable sensitivity of the measurement device 10. The insertion loss of a switch is typically lower than the coupling loss of a directional coupler. Therefore, the minimum noise figure of the receiver 27, 51 connected to the second measurement coupler 25 (LN receiver) can be lower than that of the receiver 27, 51 connected to the first measurement coupler 24 (MEAS receiver) if a switch 61 is used. For example, an improvement of roughly 10 dB in the noise level can be achieved.

Due to the above benefits (parallel measurement of LN/MEAS and reduced coupling losses), the measurement speed can be enhanced by at least a factor of 10 compared to a conventional VNA.

Preferably, the attenuators 31 and/or amplifiers 26 in FIGS. 2-7 can be arranged prior to a mixer of the second measurement coupler 25. Thus, an RF signal (and not an IF signal) is attenuated respectively amplified by the second measurement coupler 25.

The switches 52, 61 or the switching unit 41 can comprise semiconductor switches.

Figure 8:
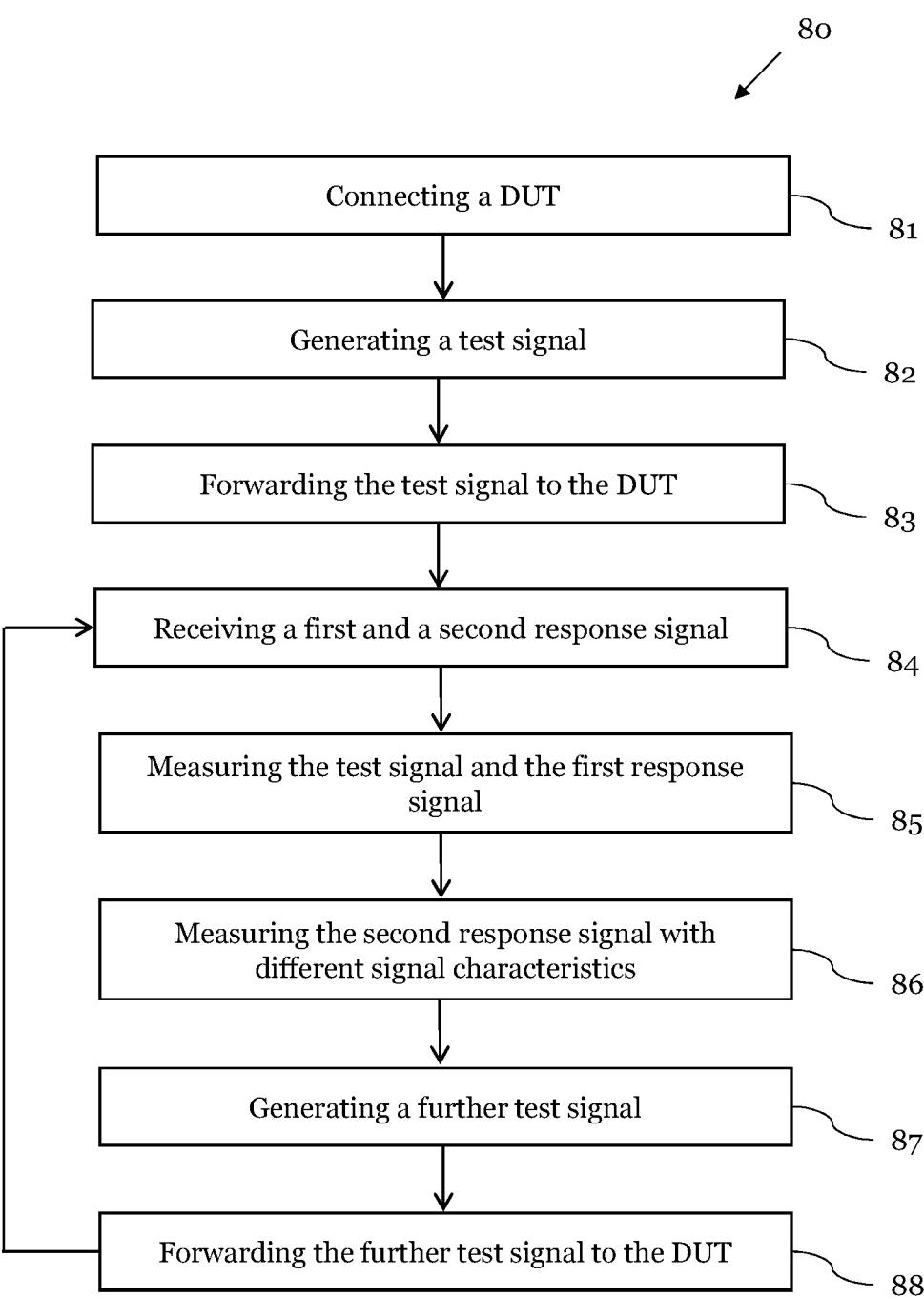
FIG. 8 shows a flow diagram of a method of analyzing a DUT according to an embodiment.

FIG. 8 shows a flow diagram of a method 80 of analyzing the DUT 20 according to an embodiment. For example, the method 80 can be carried out with the measurement device 10 as shown in any one of FIGS. 1-7.

The method 80 comprises the steps of:
a) connecting 81 the DUT 20 to a first test port 21 and to a second test port 21 of the measurement device 10;
b) generating 82 the test signal with the measurement device 10;
c) forwarding 83 the test signal to the DUT 20 via the first test port 21;
d) receiving 84 a first response signal from the DUT 20 to test signal at the first test port 21 and a second response signal from the DUT 20 to the test signal at the second test port 21;
e) measuring 85 a decoupled portion of the test signal and a decoupled portion of the first response signal received at the first test port 21; and
f) simultaneously measuring 86 a first decoupled portion and a second decoupled portion of the second response signal received at the second test port 21 and processing the first decoupled portion and/or the second decoupled portion in the digital domain, for instance depending to their respective signal level; wherein, prior to the measurement of the second decoupled portion, a characteristic, in particular a signal level, of the second decoupled portion of the second response signal is adapted such that the second decoupled portion differs from the first decoupled portion of the second response signal.

For example, the first response signal is a signal that was reflected from the DUT 20 back to the first port 21, and the second response signal is a signal that was transmitted by the DUT 20 to the second test port 21.

The method 80, can further comprise the steps of:

g) generating 87 a further test signal with the measurement device;

h) forwarding 88 the further test signal to the DUT via the second test port; and i) repeating steps d)-f) (method steps 81-86 in FIG. 8) for the further test signal, wherein the first and second test ports are interchanged. In other words, receiving a first response signal from the DUT 20 to the further test signal at the second test port 11 and a second response signal from the DUT 20 to the further test signal at the first test port 11, and subsequently performing the steps e) und f) with the further test signal and the first and the second response signal to the further test signal.

The test signal and the further test signal can be essentially identical, such that the measurement is performed in both "directions" with the same measurement conditions. In particular, the test signal and the further test signal can be swept over a certain frequency range during steps 83 and 88.

The method 80 may comprise the further step of: calculating s-parameters and/or a compression point of the DUT 20 based on the measurements of the decoupled portions of the test signal and the further test signal as well as the decoupled portions of the first and the second response signal.

Figure 9:
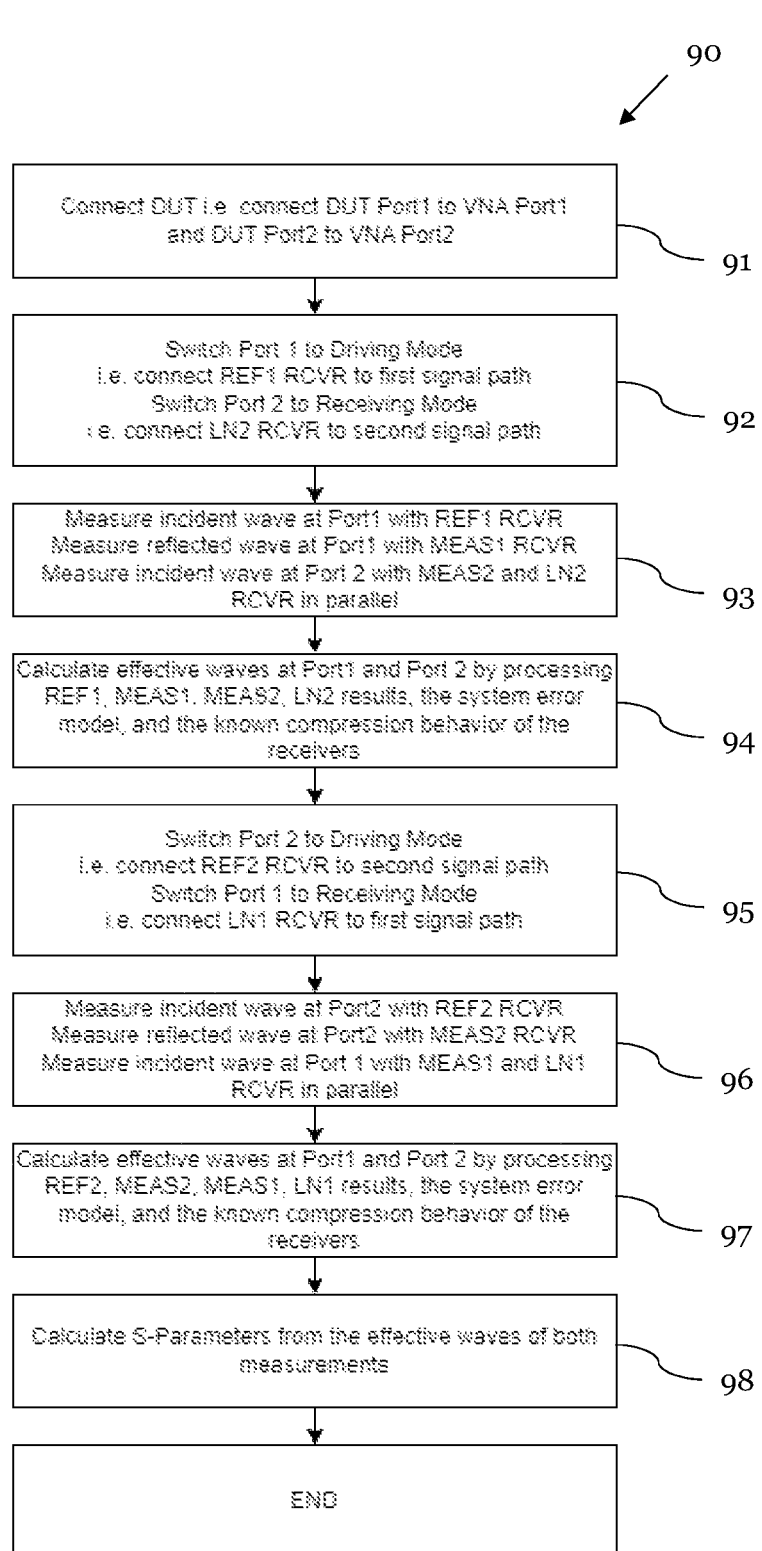
FIG. 9 shows a flow diagram of a method of analyzing a DUT according to an embodiment.

FIG. 9 shows a flow diagram of another method 90 of analyzing the DUT 20 according to an embodiment. The method 90 is based on the same general steps as the method 80 shown in FIG. 8 and can expand said method 90. Also, the method 90 can be carried out with the measurement devices 10 as shown in any one of FIGS. 1-7.

In particular, the measurement device 10 is thereby a VNA with two signal paths 22 connected to two ports 21 as shown in FIGS. 2-7. Thereby, a first signal path 21 comprises a reference coupler receiver (REF1 RCVR), a first measurement coupler receiver (MEAS1 RCVR) and a second measurement coupler receiver (LN1 RCVR), and a second signal path 21 comprises a reference coupler receiver (REF2 RCVR), a first measurement coupler receiver (MEAS2 RCVR) and a second measurement coupler receiver (LN2 RCVR). The first signal path is connected to VNA Port 1 and the second signal path is connected to VNA Port 2.

The method 90 comprises the steps of: connecting 91 a first port of the DUT 20 to VNA Port 1 and connecting a second port of the DUT to VNA Port 2; and switching 92 VNA port 1 to a driving mode and VNA port 2 to a receiving mode. For instance, in the driving mode the reference coupler REF1 RCVR is connected to a signaling line of the first signal path 21, and in the receiving mode the second measurement coupler LN2 RCVR is connected to a signaling line of the second signal path 21. For instance, these connections of the REF1 RCVR and LN2 RCVR can be established by a switch 61 as shown in FIGS. 6 and 7.

The method 90 further comprises measuring 93 an incident wave (in particular the test signal) at Port 1 with REF1 RCVR, measuring a reflected wave (in particular a first response signal) at Port 1 with MEAS1 RCVR, and measuring and incident wave (in particular a second response signal) at Port 2 with the receivers MEAS2 RCVR and LN2 RVCR in parallel.

In the further step 94, the effective waves at Port 1 and Port 2 (i.e., the test signal and the response signals) are calculated by processing the signals received and forwarded by the couplers REF1, MEAS1, MEASE2, and LN2 to their respective receivers RCVR. Thereby, a system error model and/or known compression behavior of the receivers 27, 51 are considered.

In the subsequent steps 95 and 96 the measurement is repeated, wherein Port 2 is now switched to the driving mode and Port 1 to the receiving mode, for example by connecting REF2 RCVR to the signaling line of the second signal path and connecting LN1 RCVR to the signaling line of the first signal path. Subsequently, the incident waves at Port 2 (in particular, the test signal) is measured with REF2 RCVR, the reflected wave at Port 2 (in particular, the first response signal) is measured with MEAS2 RCVR, the incident wave at Port 1 (in particular, the second response signal) is measured with the receivers MEAS1 RCVR and LN1 RCVR in parallel.

In the further step 97 (which is analogous to step 94), the effective waves at Port 1 and Port 2 (i.e., the test signal and the response signals) are calculated by processing the signals received and forwarded by the couplers REF2, MEAS2, MEASE1, and LN1 to their respective receivers RCVR. Thereby, again a system error model and/or known compression behavior of the receivers 27, 51 can be considered.

In a final step 98, s-parameters of the effective waves can be calculated from the effective waves calculated in both measurement directions.

In one embodiment of the measurement device 10, a first signal path 21 of the two or more signal paths 21 is configured to forward, via its connected test port 11, the test signal from the signal generator 15 to the DUT 20; and a second signal path 21 of the two or more signal paths 21 is configured to receive, via its connected test port 11, a response signal from the DUT 20. The measurement unit 22 of the second signal path 21 is configured to measure a first and a second decoupled portion of said response signal in parallel, wherein the first and second decoupled portion are forwarded to the measurement unit 22 by the first and second measurement couplers 24, 25 of the second signal path. The measurement unit 22 can comprise two ADC units, one for each of the first and second measurement coupler 24, 25, wherein the ADC units are configured to digitalize the first and the second decoupled portion of the response signal. The measurement unit 22 can further be configured to determines which of the decoupled signal portions it chooses for further calculation of DUT specific properties based on the signal strength and the maximum power level of the digitalized first and second decoupled signal portions provided by the respective ADCs.

All features described above or features shown in the figures can be combined with each other in any advantageous manner within the scope of the invention.

The invention claimed is:

1. A measurement device, optionally implemented as a vector network analyzer, for analyzing a device-under-test, DUT, the measurement device comprising:

a signal generator configured to generate a test signal;

two or more test ports, wherein each of the two or more test ports is adapted to be connected to the DUT, and to forward the test signal to the DUT and/or to receive a response signal from the DUT;

two or more signal paths, wherein each of the two or more signal paths is arranged to electrically connect the signal generator to one of the test ports;

wherein at least one of the signal paths comprises:

a measurement unit configured to measure radio frequency (RF) signals;

a reference coupler configured to forward a decoupled portion of the test signal to the measurement unit;

-a first measurement coupler configured to forward a first decoupled portion of the response signal to the measurement unit; and a second measurement coupler configured to forward a second decoupled portion of the response signal to the measurement unit;

wherein the second measurement coupler is configured to adapt a characteristic of the second decoupled portion of the response signal such that the second decoupled portion differs from the first decoupled portion of the response signal.

2. The measurement device of claim 1, wherein the second measurement coupler is configured to increase and/or decrease a signal level of the second decoupled portion of the response signal.

3. The measurement device of claim 1, wherein the second measurement coupler comprises at least one amplifier to increase the signal level of the second decoupled portion of the response signal and/or at least one attenuator to decrease a signal level of the second decoupled portion of the response signal.

4. The measurement device of claim 3, wherein the second measurement coupler comprises a switching unit;

wherein, in a first switching state, the switching unit is configured to switch the at least one amplifier in front of the measurement unit; and, in a second switching state, the switching unit is configured to switch the at least one attenuator in front of the measurement unit.

5. The measurement device of claim 1, further comprising:

a processing unit which is configured to receive the measurements of the decoupled portion of the test signal, the first decoupled portion of the response signal and/or the second decoupled portion of the response signal from the measurement unit, optionally in digital form;

wherein the processing unit is configured to calculate at least one DUT specific property based on said measurements.

6. The measurement device of claim 5, wherein the processing unit is configured to calculate S-parameters of the DUT based on said measurements.

7. The measurement device of claim 5, wherein the processing unit is configured to calculate a compression point of the DUT based on said measurements.

8. The measurement device of claim 1, wherein the reference coupler, the first measurement coupler, and/or the second measurement coupler each comprise at least one of: a directional coupler, a directional bridge, a resistive tap, a switch, a balun, or a diplexer.

9. The measurement device of claim 1, wherein the measurement unit comprises a respective dedicated measurement receiver for each of: the reference coupler, the first measurement coupler and the second measurement coupler.

10. The measurement device of claim 1, wherein the measurement unit comprises a common receiver which is configured to receive a signal forwarded from at least two of: the reference coupler, the first measurement coupler and the second measurement coupler.

11. The measurement device of claim 10, wherein the common receiver is arranged to receive the decoupled portion of the test signal from the reference coupler and the second decoupled portion of the response signal from the second measurement coupler.

12. The measurement device of claim 10, wherein the at least one of the signal paths further comprises:

a first switch configured to selectively connect the second measurement coupler or the reference coupler to the common receiver.

13. The measurement device of claim 1, wherein the at least one of the signal paths further comprises a second switch configured to selectively connect the signal generator or the second measurement coupler to the test port that is connected to the signal path.

14. The measurement device of claim 1, wherein the signal generator comprises a single signal source or a plurality of signal sources, for example one signal source for each signal path.

15. The measurement device of claim 1, wherein a first signal path of the two or more signal paths is configured to forward, via its connected test port, the test signal from the signal generator to the DUT and to receive a first response signal from the DUT;

wherein a second signal path of the two or more signal paths is configured to receive, via its connected test port, a second response signal from the DUT;

wherein the measurement unit of the first signal path is configured to measure the decoupled portion of the test signal as well as a first and/or a second decoupled portion of the first response signal; and wherein the measurement unit of the second signal path is configured to only measure a first and a second decoupled portion of the second response signal.

16. A method of analyzing a device-under-test, DUT, the method comprising the steps of:

a) connecting the DUT to a first test port and to a second test port of a measurement device;

b) generating a test signal with the measurement device;

c) forwarding the test signal to the DUT via the first test port;

d) receiving a first response signal from the DUT to test signal at the first test port and receiving a second response signal from the DUT to the test signal at the second test port;

e) measuring a decoupled portion of the test signal and a decoupled portion of the first response signal; and f) simultaneously measuring a first decoupled portion and a second decoupled portion of the second response signal and processing the first decoupled portion and the second decoupled portion in the digital domain;

wherein, prior to the measurement of the second decoupled portion, a characteristic, of the second decoupled portion of the second response signal, such as signal level, signal is adapted such that the second decoupled portion differs from the first decoupled portion of the second response signal.

17. The method of claim 16, further comprising the steps of:

g) generating a further test signal with the measurement device;

h) forwarding the further test signal to the DUT via the second test port;

i) receiving a first response signal from the DUT to the further test signal at the second test port and receiving a second response signal from the DUT to the further test signal at the first test port;

j) repeating the steps e)-f) for the further test signal and the first and the second response signal to the further test signal.

\* \* \* \* \*